(12) United States Patent
Liou (10) Patent No.: US 6,472,285 B1
(45) Date of Patent: Oct. 29, 2002

(54) METHOD FOR FABRICATING HIGH-Q INDUCTANCE DEVICE IN MONOLITHIC TECHNOLOGY

(75) Inventor: Ping Liou, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/303,048

(22) Filed: Apr. 30, 1999

(51) Int. Cl.[7] ................ H01L 21/331; H01L 21/8222
(52) U.S. Cl. .................. 438/319; 438/421; 438/619
(58) Field of Search ................... 257/528, 531, 257/532, 533, 522, 774; 438/319, 411, 421, 619, 699

(56) References Cited

U.S. PATENT DOCUMENTS 5,095,357 A  *  3/1992  Andoh et al. .............. 257/379
5,310,700 A  *  5/1994  Lien et al. ................. 438/618
5,641,712 A  *  6/1997  Grivna et al. .............. 438/624

* cited by examiner

Primary Examiner—Olik Chaudhuri
Assistant Examiner—Hoai Pham
(74) Attorney, Agent, or Firm—Ladas & Parry (57) ABSTRACT

The present invention provides a high-Q inductance device and a method for fabricating the same. The inductance device is formed on a semiconductor substrate and includes at least one spiral conducting line and a passivation layer formed above the spiral conducting line, the passivation layer including a spiral air gap formed within the space around the spiral conducting line. By means of the at least one spiral conducting line, the resistance of the inductance device can be decreased. Moreover, the parasitic capacitance can be decreased by means of the air gap with a low dielectric constant. Therefore, the Q value of the inductance device of the present invention can be effectively increased.

8 Claims, 9 Drawing Sheets

METHOD FOR FABRICATING HIGH-Q INDUCTANCE DEVICE IN MONOLITHIC TECHNOLOGY

BACKGROUND OF THE INVENTION

1. Field of the Invention

The present invention relates to a process for fabricating semiconductor devices, and more particularly to a monolithic high-Q inductance device and a process for fabricating the same.

2. Description of the Prior Art

Many digital and analog circuits have been successfully mass-produced by using VLSI (very large scale integrated) technology. However, radio frequency (RF) circuits, such as those used in cellular telephones, wireless modems, and other types of communication equipment, have not yet been completely implemented with integrated circuits (ICs).

Figure 1:
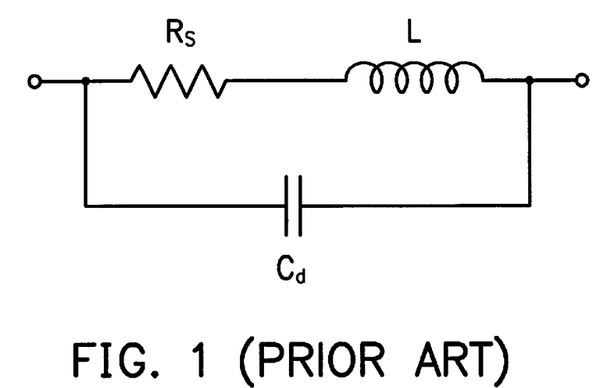
FIG. 1 shows the lump-sum equivalent circuit of a conventional inductance device.

A lump-sum equivalent circuit of a conventional inductance device is shown in FIG. 1, in which L indicates the inductance, $R_s$ the series resistance, and $C_d$ the parasitic capacitance. Quality factor (hereinafter, Q value) refers to the quality of an inductance device. It is known that the inductance generated by an ideal conducting coil has an infinitely large Q value, and thus there is no energy loss. However, to date, it has not been possible to obtain an inductance device having an infinitely large Q value. Many attempts have been made to decrease the energy loss of the inductance in order to manufacture an inductance device having high Q-value.

Figure 2:
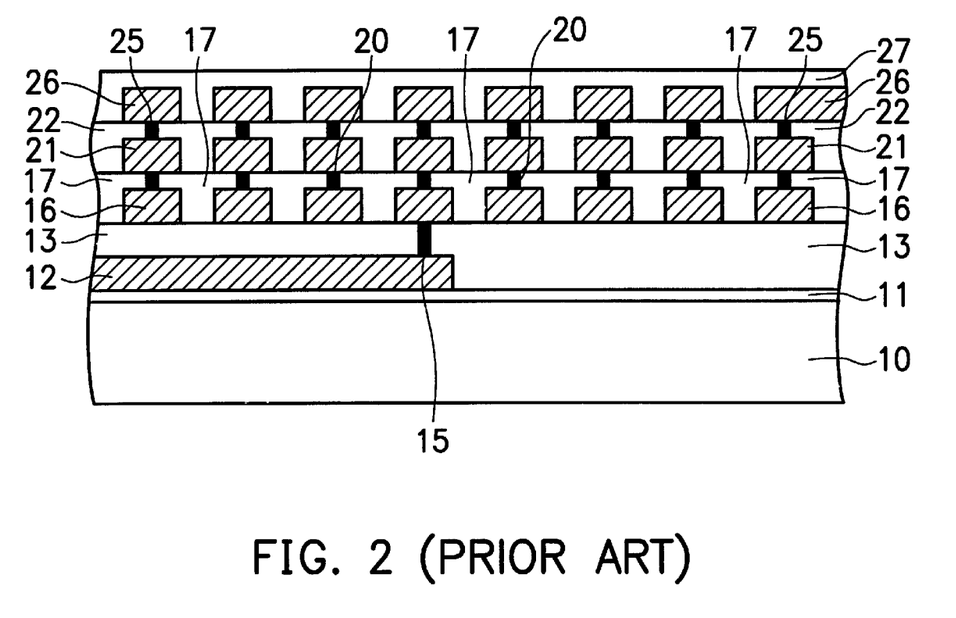
FIG. 2 is a cross-sectional view of a conventional inductance device.

A conventional inductance device, as shown in FIG. 2, has an inductor formed by a plurality of spiral conducting lines so as to decrease the serial resistance. The numerals in FIG. 2 indicate elements as follows: 10~the substrate, 11~the first dielectric layer, 12~the conducting layer, 13~the second dielectric layer, 15~the via, 16~the first spiral conducting line, 17~the second dielectric layer, 20~the first spiral via, 21~the second spiral conducting line, 22~the fourth dielectric layer, 25~the second spiral via, 26~the third spiral conducting line, and 27~the passivation layer. However, by the spiral conducting lines, both the area of the inductor and the parasitic capacitance are increased.

SUMMARY OF THE INVENTION

Therefore, an object of the present invention is to solve the above-mentioned problems and to provide an inductance device with high-Q and to provide a method for fabricating the same.

The above objects of the present invention can be achieved by providing a method for fabricating a high-Q inductance device. A first dielectric layer is formed on a semiconductor substrate. A spiral conducting line is formed above the first dielectric layer. A passivation layer is formed above the spiral conducting line and the first dielectric layer, such that a spiral air gap is formed within the space around the spiral conducting line.

According to the method for fabricating the high-Q inductance device of the present invention, a spiral air gap is formed within the space around the spiral conducting line. Since air has a very low dielectric constant, the parasitic capacitance can be decreased. Therefore, the Q value of the inductance device of the present invention can be effectively increased.

To decrease the serial resistance further, the inductance device of the present invention can also include a plurality of spiral conducting lines rather than only one spiral conducting line. For example, an inductance device having three spiral conducting lines can be fabricated according to the following procedures. First, a first dielectric layer is formed on the semiconductor substrate. Then, a first spiral conducting line is formed above the first dielectric layer. Then, a third dielectric layer is formed above the first spiral conducting line and the first dielectric layer, such that a first spiral air gap is formed within the space around the first spiral conducting line. A first spiral via is formed within the third dielectric layer above the first spiral conducting line. Subsequently, a second spiral conducting line is formed on the first spiral via, and a fourth dielectric layer on the second spiral conducting line and the third dielectric layer, such that a second spiral air gap is formed within the space around the second spiral conducting line. A second spiral via is formed within the fourth dielectric layer above the second spiral conducting line, and a third spiral conducting line is formed on the second spiral via. Finally, a passivation layer is formed on the third spiral conducting line and the fourth dielectric layer, such that a third spiral air gap is formed within the space around the third spiral conducting line. By means of the at least one spiral conducting line, the resistance of the inductance device can be decreased.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 3A:
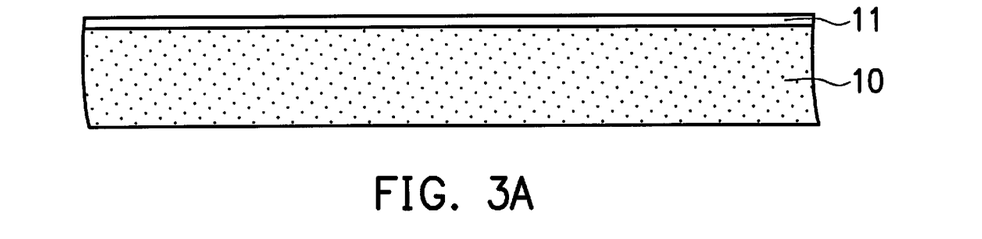
FIGS. 3A~3O are cross-sectional views illustrating the process flow of fabricating the high-Q inductance device according to the present invention.
Figure 3B:
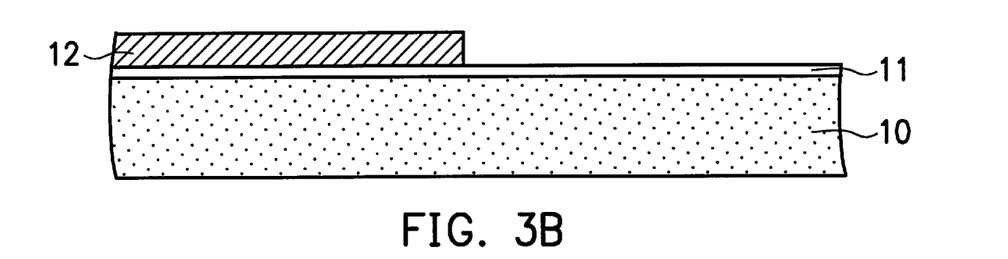
Figure 3C:
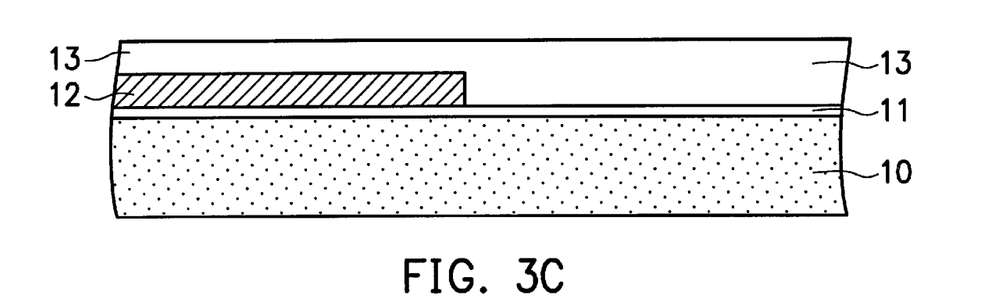
Figure 3D:
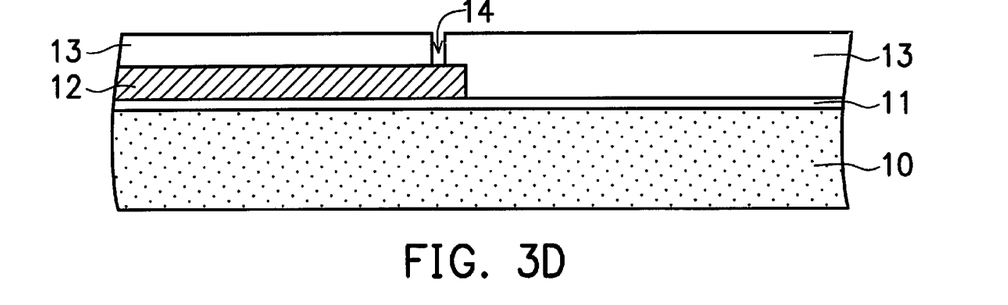
Figure 3E:
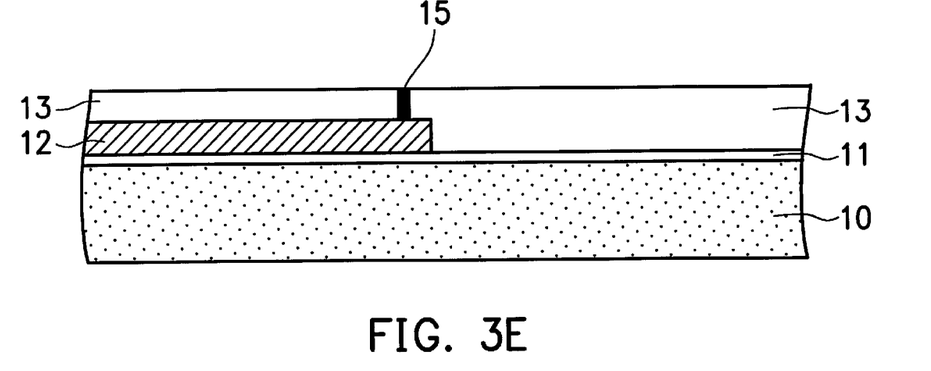
Figure 3F:
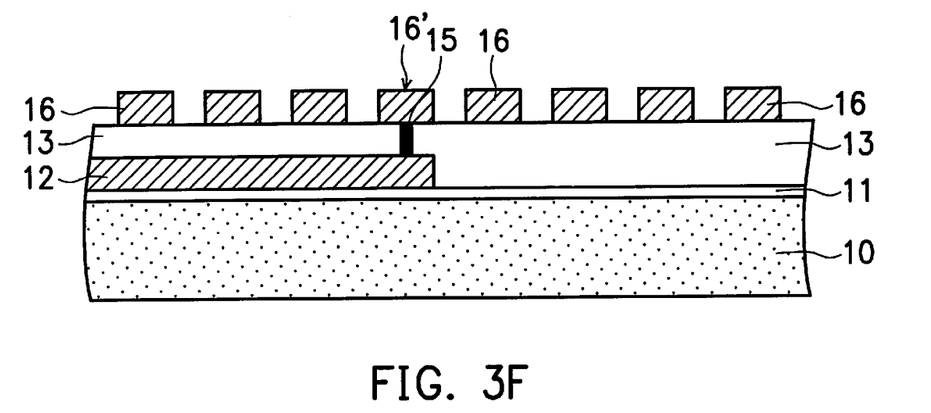
Figure 3G:
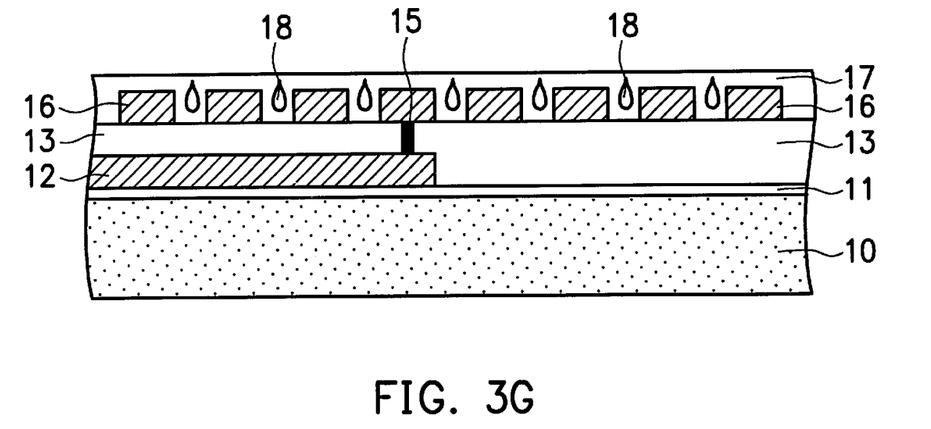
Figure 3H:
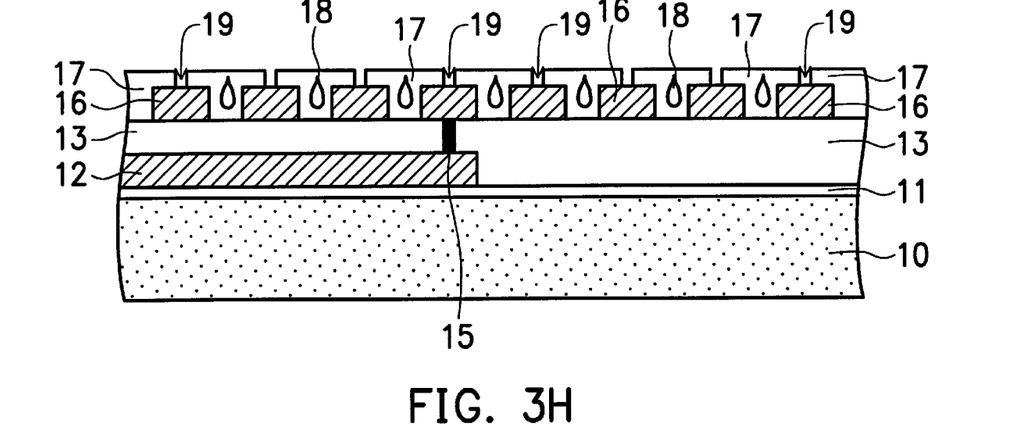
Figure 3I:
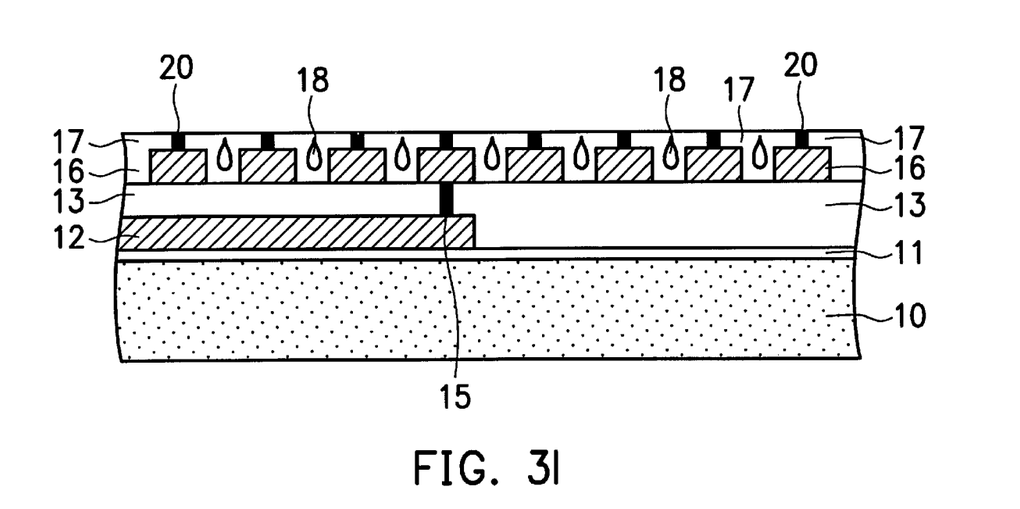
Figure 3J:
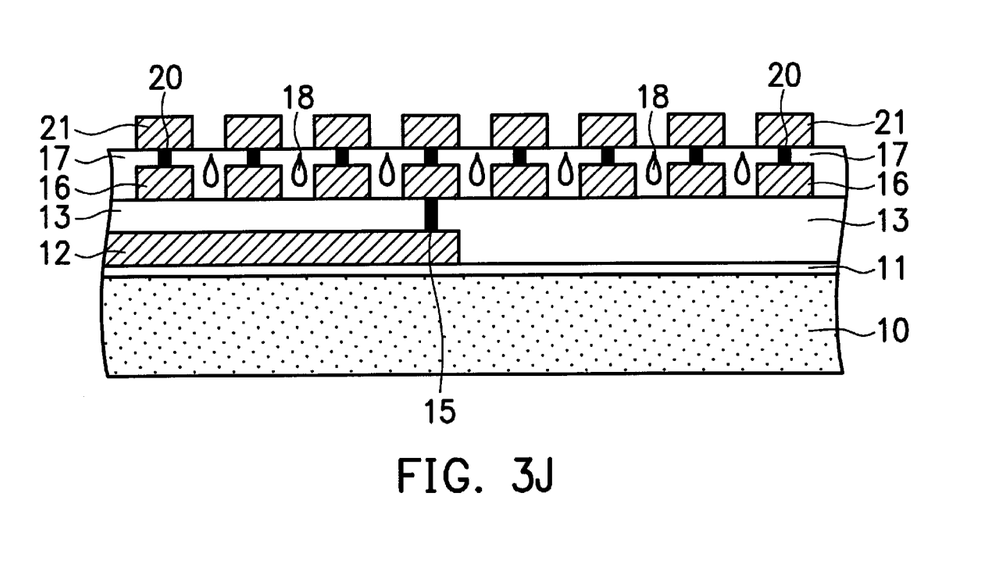
Figure 3K:
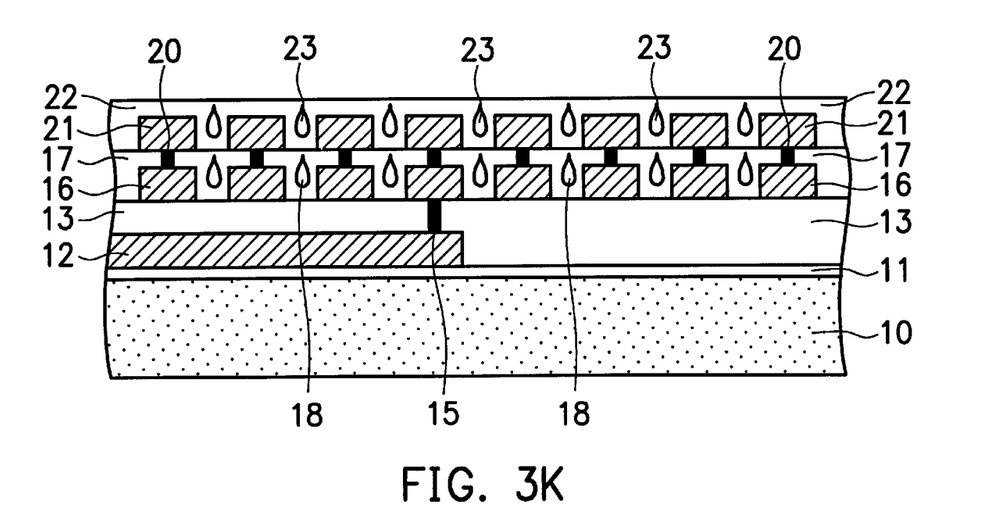
Figure 3L:
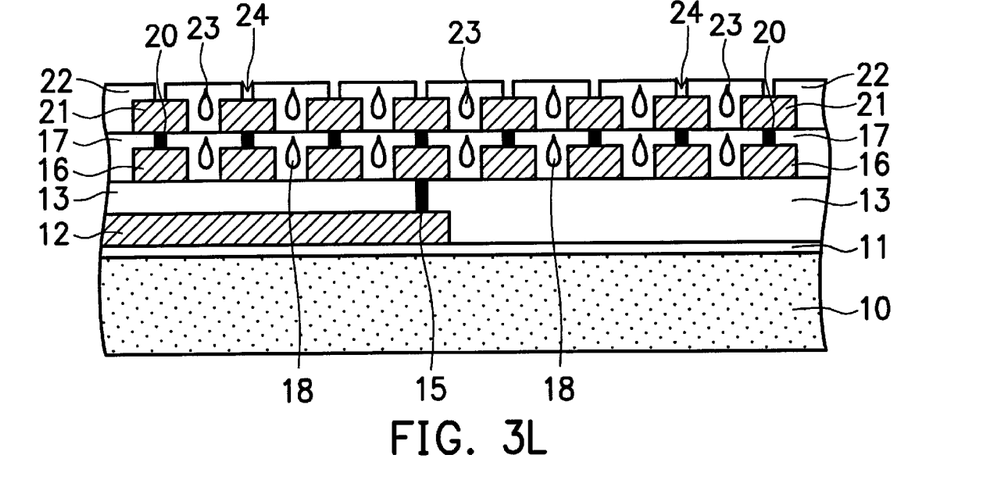
Figure 3M:
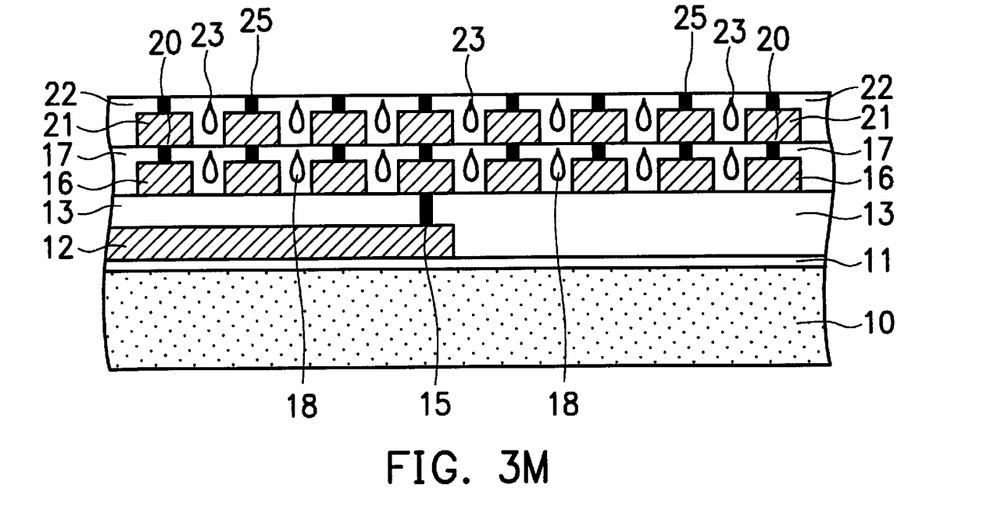
Figure 3N:
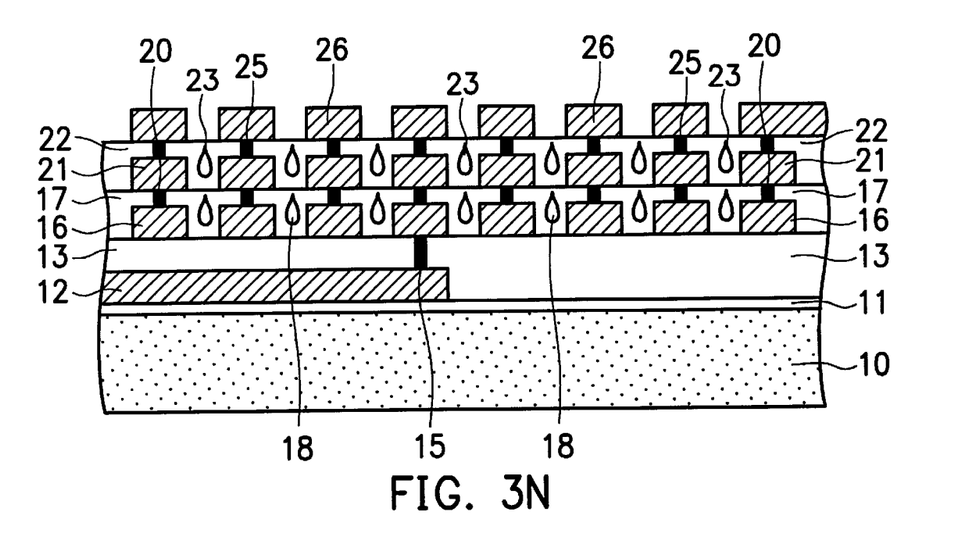
Figure 3O:
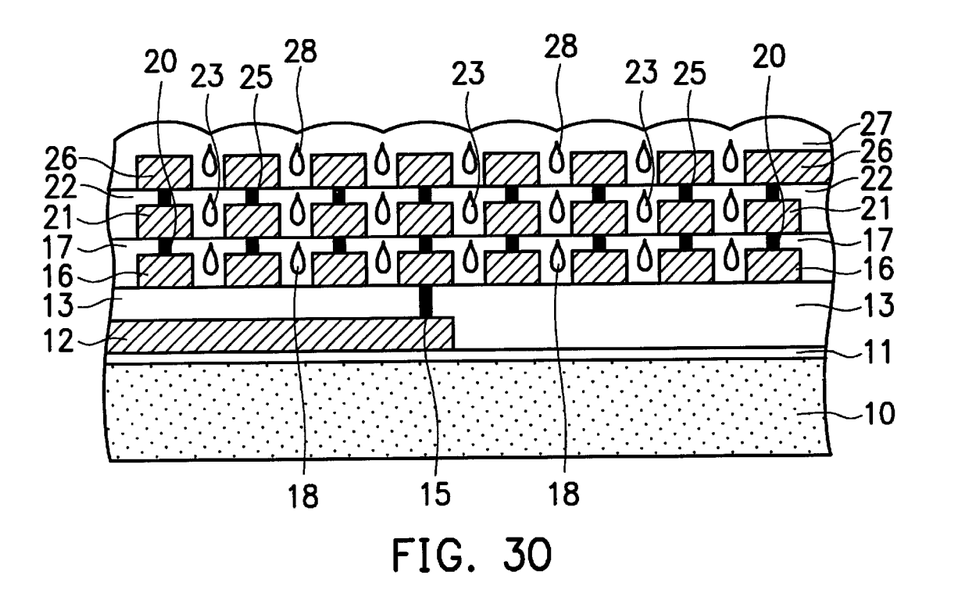

Refer to FIGS. 3A to 3O, illustrating the process flow of forming a high-Q inductance device according to the present invention. In the figures, a semiconductor substrate 10 is a silicon substrate on which a plurality semiconductor devices such as bipolar junction transistors or field effect transistors have been formed but are not shown. Referring to FIG. 3A, a first dielectric layer 11, such as a first oxide layer, is first formed over the whole surface of the semiconductor substrate 10. The rest of the manufacturing steps are as follows:

Step 1:

Referring to FIG. 3B, a conducting layer 12, such as an aluminum layer, is formed on the first dielectric layer 11 by metal sputtering, photolithography, and plasma dry etching.

Step 2:

Referring to FIG. 3C, a second dielectric layer 13, such as a second oxide layer, is formed on the conducting layer 12 and the first dielectric layer 11 by chemical vapor deposition and chemical mechanical polishing (CMP).

Step 3:

Referring to FIG. 3D, a via hole 14 is formed within the second dielectric layer 13 above the conducting layer 12 by photolithography and plasma dry etching, such that the via hole 14 is connected to the conducting layer 12.

Step 4:
Referring to FIG. 3E, a conducting via 15, such as a tungsten via, is formed in the via hole 14 by chemical vapor deposition and etching back or CMP.
Step 5:
Referring to FIG. 3F, a first spiral conducting line 16, such as a first spiral aluminum layer, is formed on the via 15 and the second dielectric layer 13 by metal sputtering, photolithography, and plasma dry etching. The formation of the first spiral conducting line 16 meets the requirements that one end 16' of the first spiral conducting line 16 is connected to the via 15, and the space around the first spiral conducting line 16 has a height/width ratio larger than 2.
Step 6:
Referring to FIG. 3G, a third dielectric layer 17, such as a third oxide layer, is formed on the first spiral conducting line 16 and the second dielectric layer 13 by chemical vapor deposition and CMP. Since the space around the first spiral conducting line 16 has a height/width ratio larger than 2, a first spiral air gap 18 will be formed within the space around the first spiral conducting line 16.
Step 7:
Referring to FIG. 3H, a first spiral via hole 19 is formed within the third dielectric layer 17 directly above the first spiral conducting line 16 by photolithography and plasma dry etching.
Step 8:
Referring to FIG. 3I, a first spiral via 20, such as a first spiral tungsten via, is formed in the first spiral via hole 19 by chemical vapor deposition and etching back or CMP.
Step 9:
Referring to FIG. 3J, a second spiral conducting line 21, such as a second spiral aluminum layer, is formed on the first spiral via 20 by metal sputtering, photolithography, and plasma dry etching. The formation of the second spiral conducting line 21 also meets the requirement that the space around the second spiral conducting line 21 has a height/width ratio larger than 2.
Step 10:
Referring to FIG. 3K, a fourth dielectric layer 22, such as a fourth oxide layer, is formed on the second spiral conducting line 21 and the third dielectric layer 17 by chemical vapor deposition and CMP. At the same time, a second spiral air gap 23 will be formed within the space around the second spiral conducting line 21.
Step 11:
Referring to FIG. 3L, a second spiral via hole 24 is formed within the fourth dielectric layer 22 directly above the second spiral conducting line 21 by photolithography and plasma dry etching.
Step 12:
Referring to FIG. 3M, a second spiral via 25, such as a second spiral tungsten via, is formed in the second spiral via hole 24 by chemical vapor deposition and etching back or CMP.
Step 13:
Referring to FIG. 3N, a third spiral conducting line 26, such as a third spiral aluminum layer, is formed on the second spiral via 25 by metal sputtering, photolithography, and plasma dry etching. The formation of the third spiral conducting line 26 also meets the requirement that the space around the third spiral conducting line 26 has a height/width ratio larger than 2.
Step 14:
Referring to FIG. 3O, a passivation layer 27, such as an oxide layer, is formed on the third spiral conducting line 26 and the fourth dielectric layer 22 by chemical vapor deposition. At the same time, a third spiral air gap 28 will be formed within the space around the third spiral conducting line 26. Subsequently, the obtained inductance device shown in FIG. 3O is immersed in an acid solution so as to increase the sizes of the first spiral air gap 18, the second spiral air gap 23, and the third spiral air gap 28.

Figure 4:
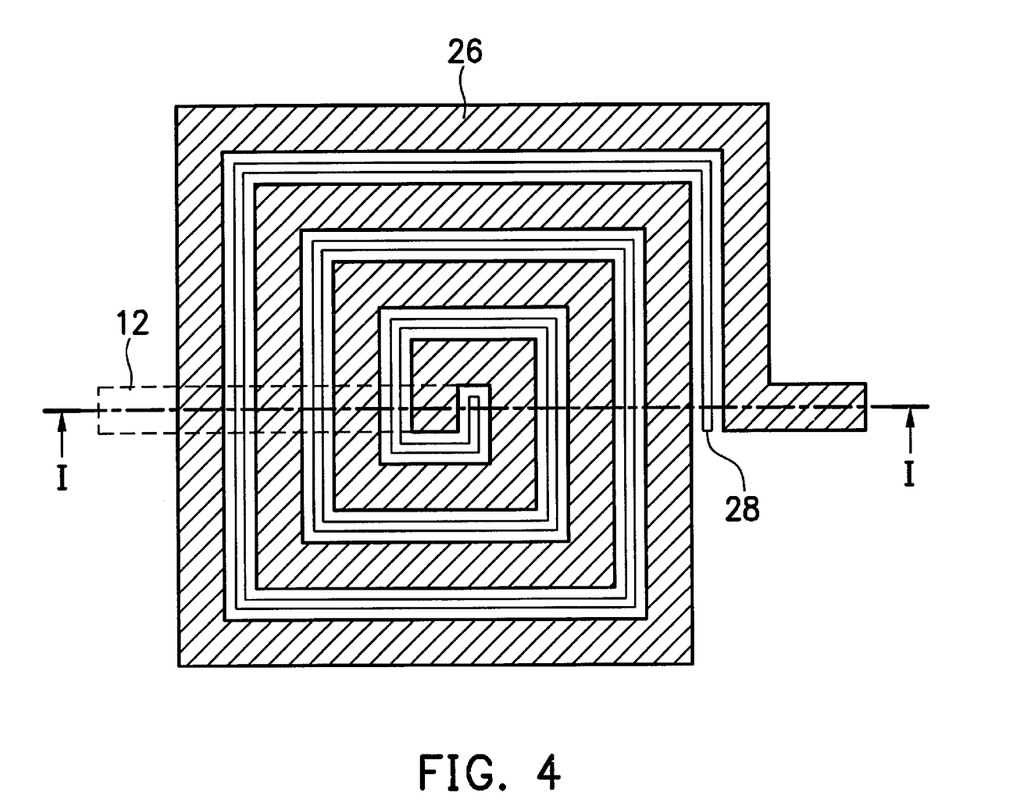
FIG. 4 is the top view of FIG. 3O.
Figure 5:
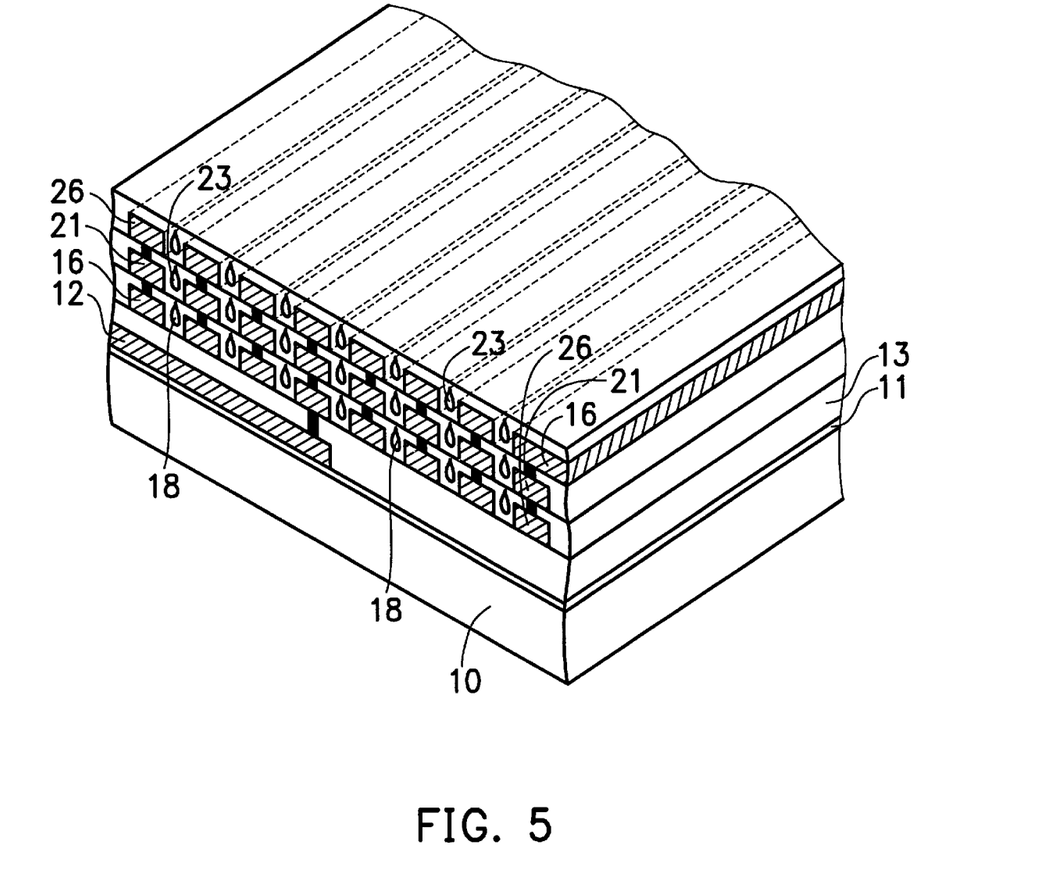
FIG. 5 is the perspective view of FIG. 3O.

In addition, FIG. 4 shows the top view of the inductance device shown in FIG. 3O, and FIG. 3O is a cross-sectional view taken along the line I—I of FIG. 4. FIG. 5 shows the perspective view of FIG. 3O.

According to the method for fabricating the high-Q inductance device of the present invention, since the inductance is generated by a plurality of spiral conducting lines, the serial resistance can be decreased. Moreover, by means of the requirement that the space around the spiral conducting line has a height/width ratio larger than 2, when a dielectric layer is formed on the spiral conducting line, a spiral air gap will be formed within the space around the spiral conducting line simultaneously. Since air has a very low dielectric constant, the parasitic capacitance can be decreased, and a high-Q inductance device can be fabricated.

In addition, the quantity of the spiral conducting lines can be varied according to need. The high-Q inductance device can be also be fabricated by the formation of only one spiral conducting line.

The foregoing description of the preferred embodiments of the present invention has been provided for the purpose of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to under stand the invention to practice various other embodiments and make various modifications suited to the particular use contemplated. It is intended that the scope of the invention be defined by the following claims and their equivalents.

What is claimed is:

1. A method for fabricating an inductance device, comprising the steps of:
   (a) providing a semiconductor substrate;
   (b) forming a first dielectric layer on the semiconductor substrate;
   (c) forming a spiral conducting line above the first dielectric layer;
   (d) forming a passivation layer above the spiral conducting line and the first dielectric layer, such that a spiral air gap is formed in the passivation layer within the space around the spiral conducting line; and
   (e) immersing the inductance device obtained from step (d) in an acid solution so as to increase the size of the spiral air gap.

2. The method as claimed in claim 1, further comprising, after step (b) and before step (c), the following steps of:
   forming a conducting layer on the first dielectric layer;
   forming a second dielectric layer on the conducting layer and the first dielectric layer; and
   forming a via within the second dielectric layer above the conducting layer,
   wherein the via is connected to one end of the spiral conducting line.

3. The method as claimed in claim 1, wherein the spiral conducting line has a height/width ratio larger than 2.

4. A method for fabricating an inductance device, comprising the steps of:

(a) providing a semiconductor substrate;

(b) forming a first dielectric layer on the semiconductor substrate;

(c) forming a first spiral conducting line above the first dielectric layer;

(d) forming a third dielectric layer above the first spiral conducting line and the first dielectric layer, such that a first spiral air gap is formed in the third dielectric layer within the space around the first spiral conducting line;

(e) forming a first spiral via within the third dielectric layer above the first spiral conducting line;

(f) forming a second spiral conducting line on the first spiral via;

(g) forming a fourth dielectric layer on the second spiral conducting line and the third dielectric layer, such that a second spiral air gap is formed in the fourth dielectric layer within the space around the second spiral conducting line;

(h) forming a second spiral via within the fourth dielectric layer above the second spiral conducting line;

(i) forming a third spiral conducting line on the second spiral via;

(j) forming a passivation layer on the third spiral conducting line and the fourth dielectric layer, such that a spiral air gap is formed in the passivation layer within the space around the third spiral conducting line; and (k) immersing the inductance device obtained form step (j) in an acid solution, so as to increase the sizes of the first, the second, and the third spiral air gaps.

5. The method as claimed in claim 4, further comprising, after step (b) and before step (c), the following steps of:

forming a conducting layer on the first dielectric layer;

forming a second dielectric layer on the conducting layer and the first dielectric layer; and forming a via within the second dielectric layer above the conducting layer, wherein the via is connected to one end of the first spiral conducting line.

6. The method as claimed in claim 4, wherein the first spiral conducting line has a height/width ratio larger than 2.

7. The method as claimed in claim 4, wherein the second spiral conducting line has a height/width ratio larger than 2.

8. The method as claimed in claim 4, wherein the third spiral conducting line has a height/width ratio larger than 2.

* * * * *